(12) United States Patent
Yamamoto et al.

(10) Patent No.: US 6,475,924 B2
(45) Date of Patent: Nov. 5, 2002

(54) SUBSTRATE AND PROCESS FOR PRODUCING THE SAME

(75) Inventors: Reo Yamamoto; Yoshihiko Numata; Yuichiro Minabe; Mitsutoshi Hikasa, all of Yamaguchi-ken (JP)

(73) Assignee: Tokuyama Corporation, Yamaguchi-ken (JP)

( * ) Notice: Subject to any disclaimer, the term of this patent is extended or adjusted under 35 U.S.C. 154(b) by 0 days.

(21) Appl. No.: 09/838,089

(22) Filed: Apr. 18, 2001

(65) Prior Publication Data

US 2001/0036506 A1 Nov. 1, 2001

Related U.S. Application Data

(62) Division of application No. 09/181,403, filed on Oct. 28, 1998.

(30) Foreign Application Priority Data

Oct. 23, 1997 (JP) .............................................. 9-297448
Oct. 13, 1998 (JP) ............................................ 10-290748

(51) Int. Cl.⁷ ............................................ H01L 21/469
(52) U.S. Cl. ........................................ 438/758; 174/257
(58) Field of Search .................................. 428/698, 457, 428/209–210, 901; 438/758; 174/257–258

(56) References Cited

U.S. PATENT DOCUMENTS

| | | | | |
|---|---|---|---|---|
| 4,642,298 A | * | 2/1987 | Kuramoto et al. ............. 501/96 |
| 5,063,183 A | * | 11/1991 | Taniguchi et al. ............. 501/96 |
| 5,229,213 A | * | 7/1993 | Horiuchi et al. ............. 428/457 |
| 5,316,985 A | * | 5/1994 | Jean et al. ..................... 501/16 |
| 5,326,623 A | | 7/1994 | Yamakawa et al. .......... 428/210 |
| 5,376,601 A | * | 12/1994 | Okawa et al. ................. 501/98 |
| 5,378,313 A | * | 1/1995 | Pace ............................. 156/643 |
| 5,646,078 A | * | 7/1997 | Mohri et al. ................... 501/98 |
| 5,770,821 A | * | 6/1998 | Hikasa et al. ................ 174/264 |
| 5,874,378 A | * | 2/1999 | Ishida et al. ................ 501/98.4 |
| 5,888,446 A | * | 3/1999 | Casey et al. ................. 264/669 |
| 6,001,760 A | * | 12/1999 | Katsuda et al. ............. 501/98.4 |
| 6,084,221 A | * | 7/2000 | Natsuhara et al. ........... 219/553 |

FOREIGN PATENT DOCUMENTS

EP   0 515 061 A1   11/1992   ........... H01L/21/48

* cited by examiner

*Primary Examiner*—David Nelms
*Assistant Examiner*—David Vu
(74) *Attorney, Agent, or Firm*—Fulbright & Jaworski L.L.P.

(57) ABSTRACT

The present invention produces the following substrate and the following process for producing the substrate. A substrate obtained by filling through holes in a sintered product of aluminum nitride with an electrically conducting layer, wherein said sintered product of aluminum nitride has a thermal conductivity of not smaller than 190 W/mK, and the adhesion strength between said sintered product of aluminum nitride and said electrically conducting layer is not smaller than 5.0 kg/mm². A process for producing the substrate comprises:

filling the through holes in a molded article of aluminum nitride comprising an aluminum nitride powder, a sintering assistant and an organic binder, with an electrically conducting paste comprising 100 parts by weight of a refractory metal powder and 2 to 10 parts by weight of an aluminum nitride powder;

dewaxing the molded article of aluminum nitride so that the content of residual carbon therein is within a range of from 800 to 3000 ppm; and firing the molded article of aluminum nitride at a temperature of from 1200 to 1700° C. and, then, at a temperature of from 1800 to 1950° C.

8 Claims, 1 Drawing Sheet

SUBSTRATE AND PROCESS FOR PRODUCING THE SAME

This application is a divisional application of U.S. Ser. No. 09/181,403, filed Oct. 28, 1998.

BACKGROUND OF THE INVENTION

1. Field of the Invention

The present invention relates to a substrate obtained by filling through holes in a sintered product of aluminum nitride with an electrically conducting layer, to a process for producing the same, and to a metallized substrate having electrically conducting patterns formed on the opposing two surfaces of the substrate and in which at least portions of the electrically conducting patterns on both surfaces are electrically connected to each other through the electrically conducting layer filled in the through holes. More particularly, the invention relates to a process for producing a sintered product of aluminum nitride having a high thermal conductivity, exhibiting favorable and intimate adhesion between the electrically conducting layer filled in the through holes and the sintered product of aluminum nitride, without developing cracks in the electrically conducting layer.

2. Prior Art

A sintered product of aluminum nitride exhibits excellent properties such as a high thermal conductivity, favorable electrically insulating property and a coefficient of thermal expansion comparable to that of silicon (Si) for forming integrated circuits, and has, hence, been used as a substrate for semiconductor circuit components. A metallized substrate of aluminum nitride has electrically conducting patterns such as metal layers and thin resistance films formed on the opposing surfaces of the sintered product and in which at least portions of the electrically conducting patterns present on both surfaces are electrically connected together through the so-called via-holes formed by filling through holes in the sintered product with an electrically conducting layer. This metallized substrate of aluminum nitride is used for a substrate such as a substrate mounting a semiconductor that is electrically connected to an external semiconductor circuit through the via-holes.

A co-firing method has been employed as a method of forming the via-holes. According to the co-firing method, the firing of the electrically conducting layer and the sintering of the substrate are simultaneously executed through one time of firing, offering an advantage in that the number of the steps can be decreased compared to the method according to which the electrically conducting layer is fired after the substrate is fired. According to the conventional method of simultaneously sintering the aluminum nitride, however, the obtained sintered product exhibits a thermal conductivity of about 170 W/mK at 25° C. due to limitation stemming from the firing of the electrically conducting layer that is effected simultaneously with the sintering of the substrate.

On the other hand, a two-step firing method has been carried out in order to fire aluminum nitride (simple substance) without having an electrically conducting layer (Japanese Unexamined Patent Publication (Kokai) No. 105525/1993). This method makes it possible to obtain a sintered product of aluminum nitride having a thermal conductivity which is as high as about 200 W/mK at 25° C. When the sintered product of aluminum nitride having via-holes and the metallized substrate is prepared according to the above-mentioned two-step firing method, however, it is difficult to obtain a sufficiently high adhesion strength between the sintered product of aluminum nitride and the electrically conducting layer forming the via-holes. Besides, cracks develop in the substrate of aluminum nitride or in the via-holes, resulting in an increase in the resistance in the via-holes and between the via-holes and the electrically conducting pattern, and a decrease in the adhesion strength between the via-holes and the thin film formed on the via-holes. Moreover, the substrate is warped to a large extent.

It has therefore been desired to develop a metallized substrate of aluminum nitride having a high thermal conductivity, exhibiting excellent adhesion strength between the electrically conducting layer forming the via-holes and the sintered product of aluminum nitride, without developing cracks in the sintered product of aluminum nitride or in the via-holes, and exhibiting a large adhesion strength between the electrically conducting pattern and the via-holes.

SUMMARY OF THE INVENTION

The present inventors have forwarded the study in order to solve the above-mentioned problems, and have discovered the fact that cracks develop in the substrate and in the via-holes and the substrate is warped by an increased amount due to the action of carbon after the dewaxing, that development of cracks in the substrate of aluminum nitride and in the via-holes and the warping of the substrate are suppressed by suppressing the content of residual carbon in the molded article after dewaxed to lie within a predetermined range, that the adhesion strength between the sintered product of aluminum nitride and the electrically conducting layer forming the via-holes can be sufficiently increased and stabilized by controlling the content of residual carbon in the dewaxed product, amount of addition of the aluminum nitride powder to the electrically conducting paste, and the temperature ranges of the two-step firing method to lie within particular ranges, that the thermal conductivity of the sintered product of aluminum nitride having via-holes can be sufficiently enhanced, and have thus arrived at the present invention.

That is, the present invention is concerned with a substrate obtained by filling through holes in a sintered product of aluminum nitride with an electrically conducting layer, wherein said sintered product of aluminum nitride has a thermal conductivity of not smaller than 190 W/mK, and the adhesion strength between said sintered product of aluminum nitride and said electrically conducting layer is not smaller than 5.0 kg/mm$^2$.

The invention is further concerned with a process for producing a substrate by filling through holes in a molded article of aluminum nitride comprising an aluminum nitride powder, a sintering assistant and an organic binder, with an electrically conducting paste comprising 100 parts by weight of a refractory metal powder and 2 to 10 parts by weight of an aluminum nitride powder, dewaxing the molded article of aluminum nitride so that the content of residual carbon therein is within a range of from 800 to 3000 ppm, firing the molded article of aluminum nitride at a temperature of from 1200 to 1700° C. and, then, at a temperature of from 1800 to 1950° C.

Furthermore, the present invention is concerned with a substrate obtained by filling through holes in the sintered product of aluminum nitride with an electrically conducting layer, wherein said sintered product of aluminum nitride has a thermal conductivity of not smaller than 190 W/mK, the adhesion strength between said sintered product of aluminum nitride and said electrically conducting layer is not smaller than 5.0 kg/mm², electrically conducting patterns are formed on both opposing surfaces of said substrate, and at least portions of the electrically conducting patterns on said both surfaces are electrically connected together through said electrically conducting layer.

DETAILED DESCRIPTION OF THE INVENTION

Figure 1:
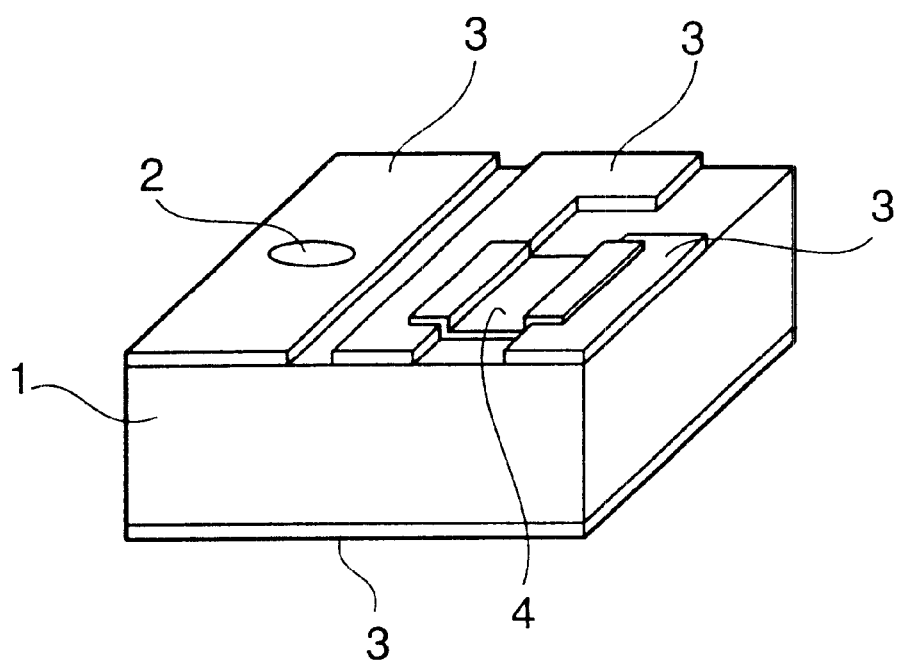
FIG. 1 is a diagram schematically illustrating a metallize substrate according to an embodiment of the present invention. 1: substrate of aluminum nitride, 2: via-hole, 3: thin metal film, and 4: thin resistance layer are shown in FIG. 1.

In the present invention, the substrate obtained by filling through holes in the sintered product of aluminum nitride with an electrically conducting layer, stands for a sintered product of aluminum nitride having so-called via-holes. Though there is no particular limitation, the through hole has a diameter of from 0.03 to 0.50 mm, and a ratio (length/diameter) of the diameter of the through hole to the length thereof is not larger than 40. Furthermore, there is no particular limitation on the material constituting the electrically conducting layer provided it is a refractory metal. Usually, however, this material is such a refractory metal as tungsten or molybdenum. In particular, it is desired that the aluminum nitride is contained in an amount of from 2 to 10 parts by weight per 100 parts by weight of the refractory metal. There is no particular limitation on the ratio of the volume of the whole sintered product of aluminum nitride including via-holes to the whole volume of the via-holes which form the electrically conducting layer. However, this ratio is usually from 0.1 to 20%.

The substrate comprising a sintered product of aluminum nitride including via-holes of the present invention has a feature in that the sintered product of aluminum nitride has a thermal conductivity of not smaller than 190 W/mK and that the adhesion strength between the sintered product of aluminum nitride and the electrically conducting layer is not smaller than 5.0 kg/mm².

The aluminum nitride substrate of the present invention is a so-called composite system including via-holes of a refractory metal. Therefore, it is difficult to correctly evaluate the thermal conductivity of the aluminum nitride substrate itself. According to the present invention, therefore, the thermal conductivity of the aluminum nitride substrate made of the same starting materials through the same dewaxing/firing batch without via-hole, is employed as the thermal conductivity of the sintered product of aluminum nitride. In the present invention, the thermal conductivity is measured at 25° C.

According to the present invention, the adhesion strength between the sintered product of aluminum nitride and the electrically conducting layer stands for a breaking strength measured by cutting the substrate across the center of the via-hole, polishing the cut surface like a mirror surface, forming a thin Ti/Pt/Au film on the cut surface, soldering a pin of a diameter of 0.5 mm having a flat end in a manner to come in contact with the surface of the via-hole perpendicularly thereto, and pulling the pin from a direction perpendicular thereto.

So far, it was difficult to accomplish both a high thermal conductivity of the sintered product of aluminum nitride and a large adhesion strength between the sintered product of aluminum nitride and the electrically conducting layer. However, the substrate of the present invention is an excellent one exhibiting the thermal conductivity of the sintered product of aluminum nitride of not smaller than 190 W/mK and an adhesion strength between the sintered product of aluminum nitride and the conducting layer of not smaller than 5.0 kg/mm², thus exhibiting both a high thermal conductivity and a large adhesion strength to the electrically conducting layer. If the production conditions are selected from more preferable ranges, it is allowed to obtain a substrate in which the thermal conductivity of the sintered product of aluminum nitride is not smaller than 200 W/mk and the adhesion strength between the sintered product of aluminum nitride and the electrically conducting layer is not smaller than 7.0 kg/mm² and, preferably, not smaller than 10.0 kg/mm².

In the present invention, there is no particular limitation on the electrically conducting patterns formed on both surfaces of the substrate provided they have an electrically conducting property. Usually, however, a thin metal film, a thick-film formed out of a mixture of a metal powder and an inorganic binder such as glass or the like, or a mixture of a metal powder and an organic binder, is used to form the electrically conducting patterns. Among them, a thin metal film is most preferably used because of its high electrically conducting property. Known metals can be used without any particular limitation for a thin metal film. Among them, titanium (Ti), chromium (Cr), molybdenum (Mo), tungsten (W), aluminum (Al), tantalum (Ta), tungsten-titanium (W—Ti), nickel-chromium (Ni—Cr) and tantalum nitride (Ta—N) can be favorably used since they can be intimately adhered to the aluminum nitride substrate.

These metals may be used in a single kind or in a combination of two or more kinds. The electrically conducting patterns may be of a single layer or may be a laminate of two or more layers.

When used being laminated in two or more layers, the above-mentioned metals can be favorably adhered to the aluminum nitride substrate and can, hence, be favorably used as the first layer that comes in direct contact with the aluminum nitride substrate. Among them, titanium exhibits large and stable adhesion strength, and is more preferably used. There is no particular limitation on the thickness of the first layer when the first layer is used as the adhesion layer. Usually, however, the first layer has a thickness of from 0.01 $\mu$m to 10 $\mu$m and, more preferably, from 0.05 $\mu$m to 5 $\mu$m from the standpoint of reliably maintaining the adhesion strength resulting from an increased film thickness, reducing the time for forming the film having a decreased thickness, and economical advantage resulting from decreased amounts of starting materials.

Here, the adhesion strength between the sintered product of aluminum nitride and the electrically conducting pattern stands for a breaking strength measured by soldering a pin of a diameter of 0.5 mm having a flat end to the uppermost layer of the electrically conducting pattern perpendicularly thereto, and pulling the pin from a direction perpendicularly thereto.

A known metal can be used as the second layer laminated on the first layer. When the laminated electrically conducting patterns of two layers are formed and when the second layer is the uppermost layer, there can be used at least any one of platinum (Pt), nickel (Ni), palladium (Pd), copper (Cu), silver (Ag), or gold (Au) because of their favorable electrically conducting property. Among them, Pt, Pd, Ag and Au are more favorably used because of their good resistance against the corrosion. As will be described later, furthermore, when the electrically conducting patterns have three or more layers by laminating other films on the second layer, there is favorably used Pt, Ni, Pd, W, W—Ti or Mo having a high diffusion-preventing ability in order to prevent the diffusion of elements between the first layer and the third layer and to stably maintain the adhesion strength between the electrically conducting patterns and the substrate. There is no particular limitation on the thickness of the second layer. On account of the same reasons as the first layer, however, the second layer usually has a thickness of from 0.05 to 10 μm and, preferably, from 0.1 to 5 μm.

When a third layer is to be laminated on the second layer, furthermore, a known metal can be used as the third layer. For example, at least any one of Pt, Ni, Pd, Cu, Ag and Au can be favorably used because of their good electrically conducting property. Among them, Pt, Pd, Ag or Au is more favorably used because of their excellent resistance against the corrosion. There is no particular limitation on the thickness of the third layer. Usually, however, the third layer has a thickness of from 0.05 μm to 10 μm from the standpoint of stable and reliable properties such as electric conductivity and economy.

In order to facilitate the soldering of semiconductor elements on the uppermost metal layer, furthermore, at least one kind of solder layer may be laminated and patterned thereon, such as gold-tin (Au—Sn) solder, lead-tin (Pb—Sn) solder, gold-silicon (Au—Si) solder or gold-germanium (Au—Ge) solder. Moreover, a layer for preventing the diffusion of the soldering material may be provided between the uppermost metal layer and the solder layer. As the diffusion-preventing layer, Pt, Ni, Pd, W, W—Ti or Mo is preferably used to exhibit a high diffusion-preventing ability.

In order to maintain a predetermined electric resistance between the particular patterns in the above-mentioned electrically conducting patterns, furthermore, a thin resistance film pattern may be formed between the particular patterns of the electrically conducting patterns so as to be connected thereto maintaining the predetermined resistance. It is desired that the resistance of the thin resistance film pattern changes little with the passage of time. It is further desired that the resistance does not change irrespective of a change in the temperature of the metallized substrate.

Though there is no particular limitation on the kind of the thin resistance film used for the pattern, usually, there is preferably used Ta—N or Ni—Cr from the standpoint of stably maintaining the resistance. The composition of the alloy may preferably be so selected that the resistance changes little with the change in the temperature. In the case of, for example, Ta—N, a composition including a $Ta_2N$ phase is preferably used. Despite the pattern size is the same, furthermore, the resistance increases with a decrease in the thickness of the thin resistance film pattern, and the resistance decreases with an increase in the thickness of the thin resistance film pattern. Accordingly, the thickness is suitably selected depending upon the required size of the pattern and the resistance. Usually, however, the thickness is selected to be from 0.01 μm to 0.5 μm from the standpoint of stability in the resistance and economy.

Next, described below is a process for producing the aluminum nitride substrate and the metallized substrate of the present invention.

In the present invention, there is no particular limitation on the aluminum nitride powder constituting the molded article of aluminum nitride, and a known one can be used. There can be preferably used a powder having an average particle diameter of not larger than 5 μm, and there can be more preferably used a powder having an average particle diameter of not larger than 3 μm, and there can be most preferably used a powder having an average particle diameter of from 0.5 to 2 μm as measured by the sedimentation method. Moreover, the aluminum nitride powder having an average particle diameter D1 as calculated from the specific surface area thereof and an average particle diameter D2 as measured by the sedimentation method, satisfying the following formulas, $$0.2 \ \mu M \leq D1 < 1.5 \ \mu m$$

$$D2/D1 \leq 2.60$$

exhibits a decreased coefficient of linear contraction during the firing, contributes to improving the dimensional stability of the sintered product and, besides, exhibits a coefficient of linear contraction close to that of the electrically conducting paste layer, making it possible to further increase the adhesion strength between the sintered product of aluminum nitride and the electrically conducting layer.

It is desired that the aluminum nitride powder contains oxygen in an amount of not larger than 3.0% by weight, and, when the aluminum nitride composition is AlN, contains cationic impurities in an amount of not larger than 0.5% by weight, and, particularly, contains oxygen in an amount of from 0.4 to 1.0% by weight, contains cationic impurities in an amount of not larger than 0.2% by weight, the total amount of Fe, Ca, Si and C in the cationic impurities being not larger than 0.17% by weight. The above aluminum nitride powder is preferably used in the present invention since it helps increase the thermal conductivity of the obtained sintered product of aluminum nitride.

A known sintering assistant can be used in the present invention without any particular limitation. Concretely speaking, there can be used an alkaline earth metal compound such as oxides like calcium oxide, a compound of yttrium or a lanthanide element such as oxides like yttrium oxide.

Moreover, a known organic binder can be used in the present invention without any particular limitation. Concretely speaking, there can be used an acrylic resin such as polyacrylic ester or polymethacrylic ester; a cellulose resin such as methyl cellulose, hydroxymethyl cellulose, nitrocellulose or cellulose acetate butylate; a vinyl group-containing resin such as polyvinyl butyral, polyvinyl alcohol or polyvinyl chloride; a hydrocarbon resin such as polyolefin; or an oxygen-containing resin such as polyethylene oxide, in one kind or being mixed in two or more kinds. Among them, the acrylic resin can be favorably used since it is favorably dewaxed and enables the resistance of the via-hole to be lowered. Furthermore, known solvents, dispersants, plasticizers and other components can be used without any particular limitation.

In the present invention, the above-mentioned components constituting the molded article of aluminum nitride are blended at known ratios without any particular limitation. For example, the sintering assistant is used in an amount of from 0.01 to 10 parts by weight and the organic binder is used in an amount of from 0.1 to 30 parts by weight per 100 parts by weight of the aluminum nitride. In particular, the aluminum nitride containing 2 to 7 parts by weight of the sintering assistant is advantageous for increasing the thermal conductivity and is, hence, preferably used. There is no particular limitation on the method of preparing a molded article of aluminum nitride using the above-mentioned components. Generally, however, the aluminum nitride is molded as a green sheet by the doctor blade method. The green sheet may be used as a single layer or may be used as a laminate of a plurality of sheets.

In the present invention, there is no particular limitation on the refractory metal powder constituting the electrically conducting paste provided it has a melting point higher than the sintering temperature of the aluminum nitride. Concretely speaking, there can be used such a metal as tungsten or molybdenum. The refractory metal powder that is generally preferably used has an average particle diameter of from 1 to 2.5 $\mu$m and, most preferably, from 1.6 to 2.0 $\mu$m as measured by the Fischer's method, since it is effective in preventing the occurrence of cracks in the via-holes.

Moreover, a known aluminum nitride powder is used for the electrically conducting paste without any particular limitation. In particular, the aluminum nitride powder that is suitably used for the molded article of aluminum nitride is sintered well with the powder of the refractory metal, and is effective in improving the adhesion of the electrically conducting layer, helps decrease the difference in the coefficient of contraction between the aluminum nitride and the electrically conducting layer, and further helps improve the dimensional stability of the sintered product.

In the present invention, the electrically conducting paste has a composition in which 100 parts by weight of the refractory metal powder is blended with 2 to 10 parts by weight of the aluminum nitride powder. In the composition of the electrically conducting paste, when the ratio of the aluminum nitride powder is smaller than 2 parts by weight, the adhesion strength decreases between the electrically conducting layer and the sintered product of aluminum nitride, or the difference in the coefficient of contraction increases between the substrate of aluminum nitride and the electrically conducting layer, resulting in the development of a gap in the junction interface. When the ratio of the aluminum nitride is greater than 10 parts by weight, on the other hand, the viscosity of the electrically conducting paste so increases that it is poorly introduced, and voids that consequently develop decrease the adhesion strength between the electrically conducting layer and the sintered product of aluminum nitride. Or, the surface of the electrically conducting layer tends to be discolored due to the aluminum nitride, and the resistance increases. When the blended amount of the aluminum nitride powder is from 3 to 7 parts by weight, the difference in the coefficient of contraction due to the firing is very small between the via-hole and the ceramics. Therefore, only small stress is produced around the via-holes, and the electric resistance of the via-holes remains small. In order to obtain a paste-like composition of the refractory metal powder and the aluminum nitride powder, in general, this composition is usually mixed with an acrylic resin such as polyacrylic ester or polymethacrylic ester; a cellulose resin such as methyl cellulose, ethyl cellulose, hydroxymethyl cellulose, nitrocellulose, or cellulose acetate butylate; a vinyl group-containing resin such as polyvinyl butyral, polyvinyl alcohol or polyvinyl chloride; a hydrocarbon resin such as polyolefin; an organic binder such as polyethylene oxide; or an organic solvent such as di-n-butyl phthalate, diethylene glycol mono-n-hexyl ether, 2-(2-butoxyethoxy)ethyl acetate or terpineol, to maintain a suitable viscosity which is, generally, from 100 to 30000 poises at 25° C./5 rpm. In preparing the electrically conducting paste, any other known dispersant, plasticizer or component may be used without any limitation.

In the present invention, the through holes in the molded article of aluminum nitride are filled with the electrically conducting paste to obtain a molded article having via-holes. There is no particular limitation on the method of forming through holes in the molded article of aluminum nitride, and a generally employed method is used such as metal mold punching method or a method using a punching machine. There is no particular limitation on the size of the through hole. However, the through hole having a diameter of from 0.05 to 0.50 mm permits the electrically conducting paste to be easily filled therein, maintains a balance in the coefficient of contraction between the aluminum nitride and the electrically conducting layer, and is preferably employed.

A known method can be used without any particular limitation for filling the through holes formed in the molded article of aluminum nitride with the above-mentioned electrically conducting paste. Concretely speaking, a printing method or a pressurized introduction method can be used. When the through hole has a ratio (length/diameter) of the diameter to the length thereof that is greater than 2.5, the pressurized introduction method is preferred since it makes it possible to fill the electrically conducting paste more efficiently.

In the present invention, the molded article of aluminum nitride having the above-mentioned via-holes may be dewaxed so that the content of residual carbon in the molded article of aluminum nitride is from 800 to 3000 ppm and, preferably, from 1200 to 2500 ppm. When the content of residual carbon is smaller than 800 ppm, the thermal conductivity of the sintered product of aluminum nitride becomes smaller than 190 W/mK, and the object of the present invention is not accomplished. When the content of residual carbon exceeds 3000 ppm, on the other hand, the refractory metal powder is poorly sintered, making it difficult to obtain a uniform and sufficiently large adhesion strength between the sintered product of aluminum nitride and the electrically conducting layer. Besides, cracks develop in the aluminum nitride and the substrate of the sintered product of aluminum nitride is warped to a large extent, making it difficult to accomplish the object of the present invention.

There is no particular limitation on the method of dewaxing the molded article of aluminum nitride so that the content of residual carbon therein lies within a range of from 800 to 3000 ppm. There is no particular limitation on the atmosphere for dewaxing provided the oxidizing atmosphere such as the open air is excluded that may oxidize the refractory metal. Concretely speaking, there can be preferably employed an inert gaseous atmosphere such as of nitrogen, argon or helium; a reducing gaseous atmosphere such as of hydrogen; a mixed gaseous atmosphere thereof; a wet gaseous atmosphere thereof; or vacuum.

The dewaxing temperature can be suitably selected. Usually, however, the dewaxing temperature is from 500 to 1200° C. and, preferably, from 800 to 1000° C. There is no particular limitation on the rate of elevating the temperature to the above-mentioned value. Preferably, however, the rate of elevating the temperature is not larger than 10° C./min.

Moreover, the dewaxing time may be so set that the content of residual carbon in the molded article after dewaxed is from 800 to 3000 ppm. The dewaxing time cannot be exclusively specified since it varies to some extent depending upon such a condition as the thickness of the molded article, density of the molded article, ratio occupied by the via-holes and the dewaxing temperature. Generally, however, the dewaxing time is from 1 to 600 minutes.

In the present invention, the molded article of aluminum nitride (hereinafter referred to as "dewaxed material") having via-holes and having a content of residual carbon of 800 to 3000 ppm therein, is then fired in a nonoxidizing atmosphere or in a dry reducing gaseous atmosphere. As the nonoxidizing atmosphere, use is made of a single gas such as nitrogen, argon or helium, or a mixture thereof. Or, the firing is conducted in vacuum or in a reduced-pressure atmosphere. As the dry reducing gaseous atmosphere, use is made of hydrogen or a gaseous atmosphere of a mixture of hydrogen and an inert gas. It is important that the firing is conducted at a temperature of from 1200 to 1700° C. and, preferably, from 1500 to 1650° C. in a first step and, then, at a temperature of from 1800 to 1950° C. and, preferably, from 1820 to 1900° C. in a second step. That is, when the firing temperature in the first step is lower than 1200° C., the reaction for removing oxygen in the aluminum nitride by reduction with carbon remaining in the dewaxed product proceeds little, the thermal conductivity of the sintered product of aluminum nitride becomes smaller than 190 W/mK, and the object of the present invention is not accomplished. When the firing temperature in the first step exceeds 1700° C., on the other hand, the aluminum nitride is sintered before the reaction for removing oxygen in the aluminum nitride by reduction with residual carbon proceeds to a satisfactory degree. Consequently, oxygen diffuses and dissolves in the aluminum nitride as a solid solution, the sintered product of aluminum nitride fails to exhibit a high thermal conductivity, and the object of the present invention is not accomplished. When the firing temperature in the first step is from 1500 to 1650° C., the reaction for removing oxygen by reduction proceeds efficiently, which is desirable. When the firing temperature in the second step is lower than 1800° C., the aluminum nitride is not sintered to a sufficient degree, the thermal conductivity of the sintered product of aluminum nitride becomes lower than 190 W/mK, and the object of the present invention is not accomplished. When the firing temperature of the second step exceeds 1950° C., the adhesion strength between the electrically conducting layer forming via-holes and the substrate decreases and, besides, the sintered product is warped to a degree greater than 200 am, making it difficult to accomplish the object of the present invention. Though there is no particular limitation, the temperature is elevated to such a value generally at a rate of 1 to 40° C./min. Though there is no particular limitation, it is desired that the above-mentioned temperatures are maintained for a period of time of from 30 minutes to 10 hours in the first step and from 1 minute to 20 hours in the second step. The firing may be executed in one time without dropping the firing temperatures in the first and second steps during the process, or may be executed being divided into two times by dropping the firing temperature between the first step and the second step. From the standpoint of time and energy efficiency, however, it is desired that the firing is executed in one time without dropping the temperature during the process.

The aluminum nitride substrate having via-holes of the present invention is used usually being metallized with a thin film on the surfaces thereof. For example, electrically conducting patterns are formed on the opposing two surfaces of the aluminum nitride substrate having via-holes obtained through the above-mentioned method, and at least portions of the electrically conducting patterns are electrically connected together through the via-holes thereby to obtain a metallized substrate of the present invention.

When the electrically conducting patterns are to be formed on the surfaces of the substrate, it is desired to grind or polish the surfaces of the substrate in order to increase the adhesion strength between the electrically conducting patterns and the substrate. The grinding and polishing can be effected relying upon a known technology without any limitation, which, usually, may be lapping, polishing, barrel-polishing, sand-blasting or polishing using a grinder. The surface coarseness of the substrate may differ depending upon the object. Usually, however, the center line average coarseness (Ra) of not larger than 0.8 $\mu$m and, more preferably, not larger than 0.05 $\mu$m is desirable from the standpoint of highly reliably soldering the semiconductor elements, etc.

The electrically conducting patterns can be formed by a known technology without any limitation. The thin metal films constituting the electrically conducting patterns can be formed relying on a known technology such as sputtering method, vaporization method, chemical vapor-phase deposition method (CVD), ion-plating method, melt-injection method, screen-printing method or sol/gel coating method based on a spin coating or dipping method. When the thin metal films constituting the electrically conducting patterns are to be formed by, for example, sputtering method, a target containing components of the thin metal films is used, the temperature of the substrate is usually set to be from room temperature to 300° C., the interior of the vacuum vessel is evacuated to be not higher than $2\times10^{-3}$ Pa, argon gas is introduced at a rate of 10 to 80 cc/min, the pressure in the vacuum vessel is maintained at 0.2 to 1.0 Pa, and the power of the RF (high-frequency) power source is set to be from 0.2 to 3 kW in order to form the thin metal films maintaining a predetermined thickness.

When a thin film of a nitride such as Ta—N or a thin film of an oxide is to be formed for constituting a thin resistance film pattern, the reactive sputtering method is preferably employed. According to the reactive sputtering method, a target containing metal components of a compound is used, and the reaction gas containing other components of the compound such as nitrogen or oxygen is introduced into the vacuum vessel simultaneously with a discharge gas, in order to obtain a thin film. The composition of the obtained thin film is determined depending upon a ratio of introducing the discharge gas and the reaction gas.

The Ta—N film is formed by the reactive sputtering by, for example, using Ta as a target, usually setting the temperature of the substrate to be room temperature to 300° C., evacuating the interior of the vacuum vessel to be not higher than $2\times10^{-3}$ Pa, introducing argon which is a discharge gas at a rate of 10 to 80 cc/min., introducing nitrogen which is a reaction gas at a rate of 0.3 to 0.7 times as much as the rate of introducing the argon gas, maintaining the pressure in the vacuum vessel at 0.2 to 1.0 Pa, and setting the power of the RF (high-frequency) power source at 0.2 to 3 kW to form the Ta—N film maintaining a predetermined thickness.

According to the present invention, any electrically conducting pattern can be formed depending upon the use by patterning the thin metal film from which the electrically conducting patterns are to be constituted. The patterning can be effected by any known technology depending upon the use of the substrate. Concretely speaking, a metal-masking method, a wet-etching method, a lift-off method or a dry-etching method can be employed. When the thin metal films are to be patterned by, for example, the metal-masking method, a metal mask forming a predetermined pattern is secured onto the aluminum nitride substrate having an electrically conducting layer formed in the through hole, and the electrically conducting patterns are formed by the sputtering method or the vapor deposition method. When the electrically conducting patterns are to be formed by the dry-etching method, furthermore, the thin metal film constituting the electrically conducting pattern is formed by the sputtering method or the vaporization method on the aluminum nitride substrate, a predetermined pattern is formed with photo-resist and so on the thin metal film, unnecessary portion of the thin metal film is removed by ion milling or the like method, and the resist is peeled off, thereby to accomplish the patterning.

There is no particular limitation on the method of forming electrically conducting patterns of when a thin resistance film pattern is included in the wiring pattern. However, the electrically conducting pattern is formed by the following methods. According to one method, the electrically conducting pattern which is added connection portions to the thin reistance film pattern is, first, formed on the aluminum nitride substrate. Next, the thin resistance film constituting the thin resistance film pattern is laminated on the electrically conducting pattern thereby to form the thin resistance film pattern. According to this method, there can be obtained a wiring pattern of a shape in which the thin resistance film is laminated on the electrically conducting pattern in the connection portions. According to another method, the thin resistance film pattern of a shape including the connection portions is formed in advance on the aluminum nitride substrate, and a thin metal film constituting a electrically conducting is laminated on the thin resistance film pattern to form an electrically conducting pattern. This method makes it possible to obtain a wiring pattern of the shape in which the electrically conducting is laminated on the thin resistance film in the connection portions. According to a further method, the thin resistance film is used as a first layer that is in direct contact with the aluminum nitride substrate, a thin metal film having an electric resistivity smaller than that of the thin resistance film is laminated thereon to form an electrically conducting pattern, and the thin metal film on the thin resistance film is partly removed from only a portion between particular patterns where a predetermined resistance is required, in order to form an electrically conducting pattern including the thin resistance film pattern in the pattern.

In order to suppress the change in the resistance due to the lapse of time and temperature, the thus obtained thin resistance pattern is usually coated on its surface with an oxide film in order to stabilize the resistance (treatment for stabilizing the resistance). A known technology can be used without any limitation to stabilize the resistance. Concretely speaking, the resistance is stabilized by forming an oxide film based on the anodic oxidation method or by forming an oxide film by heating the substrate on which the thin resistance film pattern is formed in the open air. Furthermore, the resistance of the thus formed thin resistance film pattern can be adjusted by a known technology without any limitation. Concretely speaking, the resistance is adjusted by the laser trimming method or by heating the substrate on which the thin resistance film pattern is formed in the open air.

As will be comprehended from the foregoing description, the substrate of the present invention has a thermal conductivity of not smaller than 190 W/mK at 25° C., exhibits an adhesion strength of as sufficiently large as 5.0 kg/mm$^2$ or greater between the sintered product of aluminum nitride and the electrically conducting layer forming via-holes, does not develop cracks in the sintered product of aluminum nitride or in the via-holes, and is warped little. Besides, the metallized substrate has electrically conducting patterns formed on the opposing surfaces thereof, and at least portions of the electrically conducting patterns on both surfaces thereof are electrically connected together through the via-holes, exhibits an excellent adhesion strength between the thin metal film constituting the electrically conducting pattern and the via-hole. The substrate and the metallized substrate of the present invention have therefore offered a very great industrial value. The aluminum nitride substrate that is metallized of the present invention can be favorably used as a sub-mount or a chip carrier for a laser diode and a light-emitting diode, and as parts for electronic and semiconductor devices such as heat sink, IC package, etc.

According to the process for producing substrates of the present invention, furthermore, there is obtained a substrate exhibiting a thermal conductivity of not smaller than 190 W/mK at 25° C. and an adhesion strength of as sufficiently large as 5.0 kg/mm$^2$ or more between the sintered product of aluminum nitride and the electrically conducting layer forming via-holes, without developing cracks or discoloration in the sintered product of aluminum nitride or in the via-holes, warping little, and offering a very great industrial value.

EXAMPLES

The invention will now be concretely described by way of examples to which only, however, the invention is in no way limited.

In Examples and Comparative Examples, the contents of residual carbon were analyzed by using a nondiffusion-type infrared ray-absorptive carbon analyzer (EMIA-110, manufactured by Horiba Seisakusho Co.).

The average particle diameter D1 based on the specific surface area was calculated in accordance with the following formula, $$D1\ (\mu m) = 6/(S \times 3.26)$$

[S: specific surface area of an AlN powder (m$^2$/g)]

The average particle diameter D2 based on the sedimentation method was measured by using a centrifugal particle size distribution-measuring apparatus, CAPA5000, manufactured by Horiba Seisakusho Co.

The appearance of the sintered product of aluminum nitride was observed by naked eyes and by using a stereomicroscope (×40). The warping of the sintered product of aluminum nitride was measured by using a micrometer equipped with a surface plate manufactured by Mitsutoyo Co.

The adhesion strength between the sintered product of aluminum nitride and the electrically conducting layer was measured as described below. First, the substrate was cut across the center of the via-hole of the sintered product of aluminum nitride having through holes filled with the electrically conducting layer. The cut surface was polished like a mirror surface, a thin film of Ti/Pt/Au was formed on the cut surface, and a pin plated with Ni was soldered to the surface of the via-hole perpendicularly thereto so as to come in contact therewith. The pin was made of a 42-alloy having a flat end and a diameter of 0.5 mm. The solder was composed of 60% by weight of tin and 40% by weight of lead. The pin was set to a Strograph, M2, manufactured by Toyo Seiki Co., and was pulled from a perpendicular direction to measure the breaking strength. The pulling speed was 10 mm/min. The peeling mode was examined by observing the broken surfaces of the pin and of the sintered product after the testing by using the stereomicroscope (×40), a metallized microscope (×400) and an X-ray microanalyzer.

The electrically conducting patterns were formed on the substrate of the sintered product of aluminum nitride having through holes filled with the electrically conducting layer. That is, by using a diamond grain, the surfaces of the substrate were machined until the thickness of the substrate was 0.22 mm and until mirror surfaces were formed. The center line average coarseness (Ra) on the surfaces of the thus obtained substrate was measured by using a Surfcom, 550A, manufactured by Tokyo Seimitsu Co. to be 0.02 µm.

The machined substrate was washed with ultrasonic waves in methylene chloride, dried in the vapor of methylene chloride, and thin metal films 3 were formed by sputtering on both the front and back surfaces thereof (first layer/second layer/third layer=Ti:0.1 µm/Pt:0.2 µm/Au:0.5 µm). During the sputtering, the substrate was heated at 150° C., the interior of the vacuum vessel was evacuated to be not higher than $2\times10^{-3}$ Pa, an argon gas was introduced to maintain the pressure of 0.6 Pa in the vacuum vessel, and the films were formed by using targets of Ti, Pt and Au successively under a condition of RF 0.5 kW. After the thin metal films 3 were formed, the thin metal film 3 on the front side was etched by dry-etching to form the electrically conducting pattern.

Then, a Ta—N layer for constituting a thin resistance film was formed by the reactive sputtering method maintaining a thickness of 0.1 µm on the whole front surface inclusive of the thin metal film 3. In the reactive sputtering method, the substrate was heated at 150° C., the interior of the vacuum vessel was evacuated to be not higher than $2\times10^{-3}$ Pa, an argon gas and an $N_2$ gas were introduced to maintain a pressure of 0.6 Pa in the vacuum vessel, and the film was formed using a Ta target under a condition of RF 0.5 kW. The argon gas and the $N_2$ gas were introduced at a ratio of 1:0.6. The Ta—N layer was analyzed by using a fully automatic X-ray analyzer manufactured by Nippon Phillips Co. to observe a diffraction peak due to a $Ta_2N$ phase. After the Ta—N layer has been laminated, the Ta—N layer of undesired portions was removed by wet-etching, thereby to form a thin resistance layer 4. After the thin resistance layer was formed, the substrate was heated at 360° C. for 4 hours in the open air to stabilize the resistance.

After the stabilization treatment, the metallized substrate was cut by a dicing machine into pieces each having a length of 1.0 mm and a width of 1.0 mm to thereby prepare a metallized substrate that is shown in FIG. 1.

The adhesion strength between the electrically conducting pattern on the metallized substrate and the via-hole was measured according to a method described below. That is, by using a substrate on which the thin metal film has been formed but the pattern has not yet been formed, a nickel-plated pin having a diameter of 0.5 mm was soldered onto the thin metal film on the via-hole in the substrate perpendicularly thereto so that the whole thin metal film on the via-hole was covered by the pin. The solder used was the same as the one used for measuring the adhesion strength described above. Then, the pin was pulled to find the breaking strength according to the same method as the one for measuring the strength described above, and the breaking strength was regarded to be the adhesion strength between the thin metal film that was formed and the via-hole.

The electric resistance of the via-hole in the metallized substrate cut by the dicing machine and the electric resistance of the thin resistance layer 4, were measured according to the following method. That is, as for the electric resistance of the via-hole, the back surface of the metallized substrate was soldered onto the metal substrate by using the same solder as the one used for measuring the adhesion strength, a needle-like measuring probe was brought into contact with the electrically conducting pattern on the via-hole on the front surface, and the electric resistance was measured between the probe and the metal substrate that was soldered.

As for the electric resistance of the thin resistance layer 4, the two measuring probes were brought into contact with the each two electrically conducting patterns connected to both sides of the thin resistance layer 4, and the electric resistance was measured relying on the four-terminal method.

Example 1

100 Parts by weight of an aluminum nitride powder having an average particle diameter of 1.50 µm as measured by the sedimentation method, a specific surface area of 2.50 $m^2$/g and, hence, an average particle diameter of 0.74 µm as calculated from the specific surface area, an oxygen content of 0.80% and having a composition shown in Table 1, as well as 5 parts by weight of yttria, 2 parts by weight of an n-butyl methacrylate as a dispersant, 11 parts by weight of a polybutyl acrylate as an organic binder, 7 parts by weight of a dioctyl phthalate as a plasticizer, and 50 parts by weight of a toluene-isopropyl alcohol mixture solvent, were weighed, thrown into a ball mill pot, and were mixed together to a sufficient degree by using nylon balls. The obtained slurry was introduced into a defoaming machine so as to have a viscosity of 20000 cps, and was molded into a sheet on a polypropylene film by using a sheet-molding machine of the doctor blade-type to prepare a green sheet of aluminum nitride having a thickness of about 0.50 mm. The green sheet was cut into a size of 65×65 mm. Three pieces of the green sheets of aluminum nitride were laminated one upon the other. The pressure for lamination was 50 kgf/$cm^2$, the temperature for lamination was 80° C., and the time for lamination was 15 minutes. The laminated green sheet measuring 65×65 mm was punched by using a punching metal mold having a diameter of 0.65 mm maintaining a pitch of 1.5 mm in order to form through holes arranged in a number of 40×40. Next, 5 parts by weight of the aluminum nitride powder, 1.5 parts by weight of an ethyl cellulose as an organic binder, 5.0 parts by weight of a 2-(2-butoxyethoxy)ethyl acetate as a solvent, and other plasticizers and dispersants were sufficiently kneaded by using an automatic mortar and then a roll mill having three rolls together with 100 parts by weight of a tungsten powder having an average particle diameter of 1.8 µm as measured by the Fischer's method to prepare a paste. The through holes formed in the green sheet of aluminum nitride were filled with the tungsten paste by the pressurized introduction method. The filling pressure was 80 psi and the filling time was 100 seconds.

The thus obtained molded article of aluminum nitride having via-holes was heated and dewaxed at 900° C. for 2 hours while flowing a dry nitrogen gas at a rate of 30 liters a minute. The temperature was elevated at a rate of 2.5° C./min. At the same time, the heated and dewaxed test sample was examined for its content of residual carbon to be 1800 ppm. The dewaxed product was introduced into a container made of aluminum nitride, heated at 1580° C. in a nitrogen atmosphere for 6 hours (firing in the first step) and was further heated at 1870° C. for 10 hours (firing in the second step). Cracks developed neither in the sintered product of aluminum nitride forming the substrate nor in the electrically conducting layer, and the sintered product exhibited good appearance. The substrate of the sintered product of aluminum nitride warped by 45 µm as a whole. The adhesion strength of the electrically conducting layer filled in the through hole was measured to be 17.4 kg/$mm^2$. The peeling mode was the breakage in the solder in all cases.

The electrically conducting pattern and the thin resistance layer were formed on the substrate which was then cut by using a dicing machine. The electric resistance in the via-hole in the metallized substrate was measured to be 1.5 mΩ. The electric resistance of the thin resistance layer was 20.1 Ω. The adhesion strength between the thin metal film 3 and the via-hole was 7.5 kg/mm². The simultaneously dewaxed and fired test sample (substrate) having a thickness of 0.635 mm was measured for its thermal conductivity to be 215 W/mk in compliance with a laser flash method.

Examples 2 to 6 and Comparative Examples 1 and 2

The process was repeated in the same manner as in Example 1 but changing the amount of addition of the aluminum nitride powder to the electrically conducting paste as shown in Table 2. The results were as shown in Table 2. In Comparative Example 2, the electric resistance of the thin resistance layer was measured. However, the thin resistance layer had been cut in the pattern due to cracks in the sintered product, and there was no electric conduction.

Example 7

The molded article of aluminum nitride having via-holes prepared in Example 1 was heated and dewaxed at 900° C. for 2 hours while flowing the dry nitrogen gas at a rate of 18 liters a minute. The temperature was elevated at a rate of 2.5° C./min. At the same time, the heated and dewaxed test sample was examined for its content of residual carbon to be 2800 ppm. The dewaxed product was introduced into a container made of aluminum nitride, heated at 1580° C. in a nitrogen atmosphere for 6 hours (firing in the first step) and was further heated at 1870° C. for 10 hours (firing in the second step). Cracks developed neither in the sintered product of aluminum nitride forming the substrate nor in the electrically conducting layer, and the sintered product exhibited good appearance. The substrate of the sintered product of aluminum nitride warped by 65 μm as a whole. The adhesion strength of the electrically conducting layer filled in the through hole was measured to be 16.6 kg/mm². The peeling mode was the breakage in the solder in all cases.

The electrically conducting pattern and the thin resistance layer were formed on the substrate which was then cut by using a dicing machine. The electric resistance in the via-hole in the metallized substrate was measured to be 3.0 mΩ. The electric resistance of the thin resistance layer was 20.8 Ω. The adhesion strength between the thin metal film 3 and the via-hole was 7.6 kg/mm². The simultaneously dewaxed and fired test sample (substrate) having a thickness of 0.635 mm was measured for its thermal conductivity to be 215 W/mk in compliance with the laser flash method.

Example 8

The molded article of aluminum nitride having via-holes prepared in Example 1 was heated and dewaxed at 900° C. for 2 hours while flowing the dry nitrogen gas at a rate of 23 liters a minute. The temperature was elevated at a rate of 2.5° C./min. At the same time, the heated and dewaxed test sample was examined for its content of residual carbon to be 2500 ppm. The dewaxed product was introduced into a container made of aluminum nitride, heated at 1580° C. in a nitrogen atmosphere for 6 hours (firing in the first step) and was further heated at 1870° C. for 10 hours (firing in the second step). Cracks developed neither in the sintered product of aluminum nitride forming the substrate nor in the electrically conducting layer, and the sintered product exhibited good appearance. The substrate of the sintered product of aluminum nitride warped by 54 μm as a whole. The adhesion strength of the electrically conducting layer filled in the through hole was measured to be 16.8 kg/mm². The peeling mode was the breakage in the solder in all cases.

The electrically conducting pattern and the thin resistance layer were formed on the substrate which was then cut by using a dicing machine. The electric resistance in the via-hole in the metallized substrate was measured to be 2.5 mΩ. The electric resistance of the thin resistance layer was 19.8 Ω. The adhesion strength between the thin metal film 3 and the via-hole was 7.1 kg/mm². The simultaneously dewaxed and fired test sample (substrate) having a thickness of 0.635 mm was measured for its thermal conductivity to be 215 W/mk in compliance with the laser flash method.

Example 9

The molded article of aluminum nitride having via-holes prepared in Example 1 was heated and dewaxed at 900° C. for 2 hours while flowing the dry nitrogen gas at a rate of 35 liters a minute. The temperature was elevated at a rate of 2.5° C./min. At the same time, the heated and dewaxed test sample was examined for its content of residual carbon to be 1200 ppm. The dewaxed product was introduced into a container made of aluminum nitride, heated at 1580° C. in a nitrogen atmosphere for 6 hours (firing in the first step) and was further heated at 1870° C. for 10 hours (firing in the second step). Cracks developed neither in the sintered product of aluminum nitride forming the substrate nor in the electrically conducting layer, and the sintered product exhibited good appearance. The substrate of the sintered product of aluminum nitride warped by 26 μm as a whole. The adhesion strength of the electrically conducting layer filled in the through hole was measured to be 15.6 kg/mm². The peeling mode was the breakage in the solder in all cases.

The electrically conducting pattern and the thin resistance layer were formed on the substrate which was then cut by using a dicing machine. The electric resistance in the via-hole in the metallized substrate was measured to be 1.3 mΩ. The electric resistance of the thin resistance layer was 19.6 n. The adhesion strength between the thin metal film 3 and the via-hole was 8.9 kg/mm². The simultaneously dewaxed and fired test sample (substrate) having a thickness of 0.635 mm was measured for its thermal conductivity to be 208 W/mk in compliance with the laser flash method.

Example 10

The molded article of aluminum nitride having via-holes prepared in Example 1 was heated and dewaxed at 900° C. for 2 hours while flowing a mixture gas of dry nitrogen and hydrogen at a rate of 30 liters a minute. The temperature was elevated at a rate of 2.5° C./min. At the same time, the heated and dewaxed test sample was examined for its content of residual carbon to be 900 ppm. The dewaxed product was introduced into a container made of aluminum nitride, heated at 1580° C. in a nitrogen atmosphere for 6 hours (firing in the first step) and was further heated at 1870° C. for 10 hours (firing in the second step). Cracks developed neither in the sintered product of aluminum nitride forming the substrate nor in the electrically conducting layer, and the sintered product exhibited good appearance. The substrate of the sintered product of aluminum nitride warped by 18 μm as a whole. The adhesion strength of the electrically conducting layer filled in the through hole was measured to be 14.0 kg/mm². The peeling mode was the breakage in the solder in all cases.

The electrically conducting pattern and the thin resistance layer were formed on the substrate which was then cut by using a dicing machine. The electric resistance in the via-hole in the metallized substrate was measured to be 1.0 mΩ. The electric resistance of the thin resistance layer was 20.2 Ω. The adhesion strength between the thin metal film 3 and the via-hole was 7.2 kg/mm². The simultaneously dewaxed and fired test sample (substrate) having a thickness of 0.635 mm was measured for its thermal conductivity to be 198 W/mk in compliance with a laser flash method.

Comparative Example 3

The molded article of aluminum nitride having via-holes prepared in Example 1 was heated and dewaxed at 900° C. for 2 hours while flowing a mixture gas of dry nitrogen and hydrogen at a rate of 20 liters a minute. The temperature was elevated at a rate of 2.5° C./min. At the same time, the heated and dewaxed test sample was examined for its content of residual carbon to be 600 ppm. The dewaxed product was introduced into a container made of aluminum nitride, heated at 1580° C. in a nitrogen atmosphere for 6 hours (firing in the first step) and was further heated at 1870° C. for 10 hours (firing in the second step). Cracks developed neither in the sintered product of aluminum nitride forming the substrate nor in the electrically conducting layer, and the sintered product exhibited good appearance. The substrate of the sintered product of aluminum nitride warped by 15 μm as a whole. The adhesion strength of the electrically conducting layer filled in the through hole was measured to be 8.0 kg/mm². The peeling occurred on the interface between the tungsten layer and the sintered product of aluminum nitride in all cases.

The electrically conducting pattern and the thin resistance layer were formed on the substrate which was then cut by using a dicing machine. The electric resistance in the via-hole in the metallized substrate was measured to be 0.9 mΩ. The electric resistance of the thin resistance layer was 20.8 Ω. The adhesion strength between the thin metal film 3 and the via-hole was 6.0 kg/mM². The simultaneously dewaxed and fired test sample (substrate) having a thickness of 0.635 mm was measured for its thermal conductivity to be 168 W/mk in compliance with the laser flash method.

Comparative Example 4

The molded article of aluminum nitride having via-holes prepared in Example 1 was heated and dewaxed at 900° C. for 2 hours while flowing a dry nitrogen at a rate of 5 liters a minute. The temperature was elevated at a rate of 2.5° C./min. At the same time, the heated and dewaxed test sample was examined for its content of residual carbon to be 3500 ppm. The dewaxed product was introduced into a container made of aluminum nitride, heated at 1580° C. in a nitrogen atmosphere for 6 hours (firing in the first step) and was further heated at 1870° C. for 10 hours (firing in the second step). Cracks developed in the sintered product of aluminum nitride forming the substrate. The substrate of the sintered product of aluminum nitride warped by 242 μm as a whole. The adhesion strength of the electrically conducting layer filled in the through hole was measured to be 3.3 kg/mm². The peeling occurred on the interface between the tungsten layer and the sintered product of aluminum nitride in all cases.

The electrically conducting pattern and the thin resistance layer were formed on the substrate which was then cut by using a dicing machine. The electric resistance in the via-hole in the metallized substrate was measured to be 8.9 mΩ. Though the electric resistance of the thin resistance layer was measured, the thin resistance layer had been cut in the pattern due to cracks in the sintered product, and there was no electric conduction. The adhesion strength between the thin metal film 3 and the via-hole was 2.8 kg/mm². The simultaneously dewaxed and fired test sample (substrate) having a thickness of 0.635 mm was measured for its thermal conductivity to be 195 W/mk in compliance with the laser flash method.

Examples 11 to 15 and Comparative Examples 5 and 6

The process was carried out in the same manner as in Example 1 but changing the firing temperature in the first step as shown in Table 2. The results were as shown in Table 2.

Examples 16 to 18 and Comparative Examples 7 and 8

The process was carried out in the same manner as in Example 1 but changing the firing temperature in the second step as shown in Table 2. The results were as shown in Table 2.

Example 19

The molded article of aluminum nitride having via-holes prepared in Example 1 was heated and dewaxed at 900° C. for 2 hours while flowing a dry nitrogen gas at a rate of 30 liters a minute. The temperature was elevated at a rate of 2.5° C./min. At the same time, the heated and dewaxed test sample was examined for its content of residual carbon to be 1800 ppm. The dewaxed product was introduced into a container made of aluminum nitride, heated at 1350° C. in a nitrogen atmosphere for 6 hours (firing in the first step) and the temperature was lowered. At the same time, the fired sample was measured for its content of residual carbon to be 320 ppm. After the firing in the first step, the sample was further heated at 1870° C. for 10 hours (firing in the second step). Cracks developed neither in the sintered product of aluminum nitride forming the substrate nor in the electrically conducting layer, and the sintered product exhibited good appearance. The substrate of the sintered product of aluminum nitride warped by 46 μm as a whole. The adhesion strength of the electrically conducting layer filled in the through hole was measured to be 16.7 kg/mm². The peeling mode was the breakage in the solder in all cases.

The electrically conducting pattern and the thin resistance layer were formed on the substrate which was then cut by using a dicing machine. The electric resistance in the via-hole in the metallized substrate was measured to be 2.7 mΩ. The electric resistance of the thin resistance layer was 20.6 Ω. The adhesion strength between the thin metal film 3 and the via-hole was 7.6 kg/mm². The simultaneously dewaxed and fired test sample (substrate) having a thickness of 0.635 mm was measured for its thermal conductivity to be 205 W/mk in compliance with the laser flash method.

Comparative Example 9

The molded article of aluminum nitride having via-holes prepared in Example 1 was heated and dewaxed at 900° C. for 2 hours while flowing a dry nitrogen gas at a rate of 3 liters a minute. The temperature was elevated at a rate of 2.5° C./min. At the same time, the heated and dewaxed test sample was examined for its content of residual carbon to be 4500 ppm. The dewaxed product was introduced into a container made of aluminum nitride, heated at 1350° C. in a nitrogen atmosphere for 6 hours (firing in the first step) and the temperature was lowered. At the same time, the fired sample was measured for its content of residual carbon to be 850 ppm. After the firing in the first step, the sample was further heated at 1870° C. for 10 hours (firing in the second step). Cracks developed in the sintered product of aluminum nitride forming the substrate. The substrate of the sintered product of aluminum nitride warped by 327 μm as a whole. The adhesion strength of the electrically conducting layer filled in the through hole was measured to be 3.2 kg/mm². The peeling occurred on the interface between the tungsten layer and the sintered product of aluminum nitride in all cases.

The electrically conducting pattern and the thin resistance layer were formed on the substrate which was then cut by using a dicing machine. The electric resistance in the via-hole in the metallized substrate was measured to be 10.0 mΩ. Though the electric resistance of the thin resistance layer was measured, the thin resistance layer had been cut in the pattern due to cracks in the sintered product, and there was no electric conduction. The adhesion strength between the thin metal film 3 and the via-hole was 7.6 kg/mm². The simultaneously dewaxed and fired test sample (substrate) having a thickness of 0.635 mm was measured for its thermal conductivity to be 196 W/mk in compliance with the laser flash method.

TABLE 1

| (Analytical values of the AlN powder) | |
|---|---|
| AlN content | 97.8% |
| Element | Content |
| Ca | 105 ppm |
| Si | 63 ppm |
| Fe | 12 ppm |
| Ti | 16 ppm |
| V | 0.8 ppm |
| O | 0.80% |
| C | 0.03% |

TABLE 2

| | Amount of AlN (parts by wt.) | Content of residual carbon (ppm) | Appearance of sintered product (note 1) | Warping of sintered product (μm) | Thermal conductivity of sintered product (w/mK) | Adhesion strength of electrically conducting layer (kg/mm²) |
|---|---|---|---|---|---|---|
| Ex. 1 | 5.0 | 1800 | o | 45 | 215 | 17.4 |
| Ex. 2 | 8.5 | 1800 | o | 49 | 214 | 17.9 |
| Ex. 3 | 6.5 | 1800 | o | 43 | 212 | 17.6 |
| Ex. 4 | 4.0 | 1800 | o | 49 | 215 | 16.8 |
| Ex. 5 | 3.0 | 1800 | o | 38 | 213 | 15.8 |
| Ex. 6 | 2.0 | 1800 | o | 45 | 210 | 13.0 |
| Ex. 7 | 5.0 | 2800 | o | 65 | 215 | 16.6 |
| Ex. 8 | 5.0 | 2500 | o | 54 | 215 | 16.8 |
| Ex. 9 | 5.0 | 1200 | o | 26 | 208 | 15.6 |
| Ex. 10 | 5.0 | 900 | o | 18 | 198 | 14.0 |

| | Peeling mode | Electric resistance of via-hole (mΩ) | Firing temp. (° C.) 1st step | Firing temp. (° C.) 2nd step | Electric Resistance of thin resistance layer (Ω) | Adhesion strength between thin metal film and via-hole (kg/mm²) |
|---|---|---|---|---|---|---|
| Ex. 1 | in the solder | 1.5 | 1580 | 1870 | 20.1 | 7.5 |
| Ex. 2 | in the solder | 3.0 | 1580 | 1870 | 20.0 | 9.1 |
| Ex. 3 | in the solder | 2.0 | 1580 | 1870 | 21.0 | 7.3 |
| Ex. 4 | in the solder | 1.2 | 1580 | 1870 | 20.8 | 7.6 |
| Ex. 5 | in the solder | 1.0 | 1580 | 1870 | 20.6 | 8.0 |
| Ex. 6 | in the solder | 0.8 | 1580 | 1870 | 19.8 | 8.0 |
| Ex. 7 | in the solder | 3.0 | 1580 | 1870 | 20.8 | 7.6 |
| Ex. 8 | in the solder | 2.5 | 1580 | 1870 | 19.8 | 7.1 |
| Ex. 9 | in the solder | 1.3 | 1580 | 1870 | 19.6 | 8.9 |
| Ex. 10 | in the solder | 1.0 | 1580 | 1870 | 20.2 | 7.2 |

(note 1)
o represents good appearance of the sintered product.
x represents cracks in the Al nitride substrate or in the via-holes, or the occurrence of discoloration.

TABLE 3

| | Amount of AlN (parts by wt.) | Content of residual carbon (ppm) | Appearance of sintered product (note 1) | Warping of sintered product (μm) | Thermal conductivity of sintered product (w/mK) | Adhesion strength of electrically conducting layer (kg/mm$^2$) |
|---|---|---|---|---|---|---|
| Ex. 11 | 5.0 | 1800 | ○ | 42 | 205 | 17.2 |
| Ex. 12 | 5.0 | 1800 | ○ | 48 | 202 | 16.6 |
| Ex. 13 | 5.0 | 1800 | ○ | 45 | 207 | 17.0 |
| Ex. 14 | 5.0 | 1800 | ○ | 39 | 210 | 17.4 |
| Ex. 15 | 5.0 | 1800 | ○ | 45 | 211 | 17.4 |
| Ex. 16 | 5.0 | 1800 | ○ | 32 | 207 | 17.6 |
| Ex. 17 | 5.0 | 1800 | ○ | 42 | 216 | 16.6 |
| Ex. 18 | 5.0 | 1800 | ○ | 43 | 221 | 15.6 |
| Ex. 19 | 5.0 | 1800 | ○ | 46 | 205 | 16.7 |

| | Peeling mode | Electric resistance of via-hole (mΩ) | Firing temp. (° C.) 1st step | Firing temp. (° C.) 2nd step | Electric Resistance of thin resistance layer (Ω) | Adhesion strength between thin metal film and via-hole (kg/mm$^2$) |
|---|---|---|---|---|---|---|
| Ex. 11 | in the solder | 3.5 | 1250 | 1870 | 20.6 | 7.7 |
| Ex. 12 | in the solder | 2.5 | 1350 | 1870 | 19.8 | 7.3 |
| Ex. 13 | in the solder | 2.0 | 1450 | 1870 | 20.2 | 8.0 |
| Ex. 14 | in the solder | 1.6 | 1500 | 1870 | 20.8 | 8.7 |
| Ex. 15 | in the solder | 1.4 | 1650 | 1870 | 20.6 | 8.3 |
| Ex. 16 | in the solder | 1.7 | 1580 | 1820 | 19.8 | 7.2 |
| Ex. 17 | in the solder | 1.4 | 1580 | 1900 | 20.8 | 7.0 |
| Ex. 18 | in the solder | 1.2 | 1580 | 1930 | 20.2 | 8.8 |
| Ex. 19 | in the solder | 2.7 | 1350 | 1870 | 20.6 | 7.6 |

(note 1)
○ represents good appearance of the sintered product.
x represents cracks in the Al nitride substrate or in the via-holes, or the occurrence of discoloration.

TABLE 4

| | Amount of AlN (parts by wt.) | Content of residual carbon (ppm) | Appearance of sintered product (note 1) | Warping of sintered product (μm) | Thermal conductivity of sintered product (w/mK) | Adhesion strength of electrically conducting layer (kg/mm$^2$) |
|---|---|---|---|---|---|---|
| Comp. Ex. 1 | 0.0 | 1800 | x | 45 | 207 | 2.2 |
| Comp. Ex. 2 | 11.0 | 1800 | x | 42 | 205 | 3.1 |
| Comp. Ex. 3 | 5.0 | 600 | ○ | 15 | 168 | 8.0 |
| Comp. Ex. 4 | 5.0 | 3500 | x | 242 | 195 | 3.3 |
| Comp. Ex. 5 | 5.0 | 1800 | ○ | 40 | 170 | 11.0 |
| Comp. Ex. 6 | 5.0 | 1800 | ○ | 49 | 171 | 14.0 |
| Comp. Ex. 7 | 5.0 | 1800 | x | 45 | 158 | 2.2 |
| Comp. Ex. 8 | 5.0 | 1800 | x | 251 | 206 | 2.6 |
| Comp. Ex. 9 | 5.0 | 4500 | x | 327 | 196 | 3.2 |

| | Peeling mode | Electric resistance of via-hole (mΩ) | Firing temp. (° C.) 1st step | Firing temp. (° C.) 2nd step | Electric Resistance of thin resistance layer (Ω) (note 2) | Adhesion strength between thin metal film and via-hole (kg/mm$^2$) |
|---|---|---|---|---|---|---|
| Comp. Ex. 1 | W/AlN | 0.7 | 1580 | 1870 | 20.2 | 2.6 |
| Comp. Ex. 2 | W/AlN | 10.2 | 1580 | 1870 | — | 2.4 |
| Comp. Ex. 3 | W/AlN | 0.9 | 1580 | 1870 | 20.8 | 6.0 |
| Comp. Ex. 4 | W/AlN | 8.9 | 1580 | 1870 | — | 2.8 |
| Comp. Ex. 5 | in the solder | 12.5 | 1100 | 1870 | 20.2 | 6.7 |

TABLE 4-continued

| Comp. Ex. 6 | in the solder | 3.0 | 1800 | 1870 | 20.0 | 7.0 |
| Comp. Ex. 7 | W/AlN | 2.5 | 1580 | 1750 | 20.8 | 3.2 |
| Comp. Ex. 8 | W/AlN | 4.0 | 1580 | 2000 | — | 2.6 |
| Comp. Ex. 9 | W/AlN | 10.0 | 1350 | 1870 | — | 2.3 |

(note 1)
o represents good appearance of the sintered product.
x represents cracks in the Al nitride substrate or in the via-holes, or the occurrence or discoloration.
(note 2)
— represents that there was no electric conduction.

What is claimed is:

1. A process for producing a substrate composed of an AlN sintered product having a via-hole conductor, the substrate having a thermal conductivity of not smaller than 190 W/mK, the adhesion strength between the AlN sintered product and the via-hole conductor of not smaller than 5.0 kg/mm$^2$, said process comprising the following steps:
    filling through holes in an AlN molded article comprising aluminum nitride powder, a sintering assistant and an organic binder, with an electrically conducting paste comprising 100 parts by weight of a refractory metal powder having a melting point of higher than a sintering temperature of the AlN molded article and 2 to 10 parts by weight of an aluminum nitride powder,
    dewaxing the AlN molded article so that the content of residual carbon therein is within a range of from 800 to 3000 ppm, and
    two-step firing of the AlN molded article at a temperature of 1200 to 1700° C. and at a temperature of 1800 to 1950° C.

2. A process for producing a substrate according to claim 1, wherein the AlN molded article is dewaxed so that the content of residual carbon therein is in a range of from 1200 to 2500 ppm.

3. A process for producing a substrate according to claim 1, wherein the AlN molded article comprises an aluminum nitride powder containing from 0.4 to 1.0% by weight of oxygen, a sintering assistant and an organic binder.

4. A process for producing a substrate according to claim 1, wherein said electrically conducting paste comprises 100 parts by weight of a refractory metal powder and from 3 to 7 parts by weight of an aluminum nitride powder.

5. A process for producing a substrate according to claim 1, wherein after the dewaxing, the AlN molded article is two-step fired at a temperature of 1500 to 1650° C. and at a temperature of 1800 to 1950° C.

6. A process for producing a substrate according to claim 1, wherein after the dewaxing, the AlN molded article is two-step fired at a temperature of 1200 to 1700° C. and at a temperature of 1820 to 1900° C.

7. A process for producing a substrate of claim 1 comprising the following stages:
    filling through holes in an AlN molded article comprising aluminum nitride powder containing from 0.4 to 1.0% by weight of oxygen, a sintering assistant and an organic binder, with an electrically conducting paste comprising 100 parts by weight of a refractory metal powder and 3 to 7 parts by weight of an aluminum nitride powder,
    dewaxing the AlN molded article so that the content of residual carbon therein is within a range of from 1200 to 2500 ppm, and
    two-step firing of the AlN molded article at a temperature of 1500 to 1650° C. and at a temperature of 1820 to 1900° C.

8. A process for producing a substrate composed of an AlN sintered product having a via-hole conductor, the substrate having a thermal conductivity of not smaller than 190 W/mK, the adhesion strength between the AlN sintered product and the via-hole conductor of not smaller than 5.0 kg/mm$^2$, said process comprising the following steps:
    filling through holes in an AlN molded article comprising aluminum nitride powder containing from 0.4 to 1.0% by weight of oxygen, a sintering assistant and an organic binder, with an electrically conducting paste comprising 100 parts by weight of a refractory metal powder and 3 to 7 parts by weight of an aluminum nitride powder,
    dewaxing the AlN molded article so that the content of residual carbon therein is within a range of from 1200 to 2500 ppm, and
    two-step firing of the AlN molded article at a temperature of 1500 to 1650° C. and at a temperature of 1820 to 1900° C.

* * * * *